United States Patent Office 3,136,638

Patented June 9, 1964

3,136,638

PHOTOSENSITIVE STENCIL AND PROCESS OF MAKING THE SAME

Andre K. Schwerin, Binghamton, Walter F. Burrows, Greene, and Helene D. Evans, Endwell, N.Y., assignors to General Aniline & Film Corporation, New York, N.Y., a corporation of Delaware No Drawing. Filed June 26, 1959, Ser. No. 823,004
3 Claims. (Cl. 96—75)

This invention relates to a printing device and to a process for producing the same. More particularly, this invention relates to a photosensitive stencil and to a novel process used in its production.

Photosensitive stencils adapted to the duplicating of drawings, line and halftone copies, to electrical circuit printing, textile printing, etc., are widely used. Such photosensitive stencils are based on either sensitization of the stencil screen with solutions of bichromated gelatin, subsequent tanning and washout relief formation or on strip film transfer of tanned silver halide gelatin emulsions followed, likewise, by washout resist formation. Besides the instability of material stabilized with chromium salts, processes using washout operations are prone to cause shrinkage and distortion of the relief formed. The disadvantages of these processes result from the fact that they are multi-step processes involving chemical sensitization, photographic developing, fixing and drying operations.

British Patent 665,649 discloses the use of a photographic film for the production of a printing stencil, wherein a layer of gelatin containing a light sensitive iron salt is treated, after exposure, with an oxidizing agent producing tanning of the gelatin in the exposed areas, where the iron salt as a result of photoreduction, has been reduced to the ferrous state. The unreacted gelatin has to be washed out of the resist before the latter can be applied to silk or similar stencil mesh. After drying, the base material of the film is stripped away from the gelatin resist leaving it adhering to the mesh material to form a stencil. This process is also a multi-step process involving washout and drying operations apt to introduce eventual shrinkage and distortion of the remnant resist.

It is accordingly an object of this invention to provide a novel process for producing a stencil of the type described which overcomes the disadvantages of the known process as enumerated above.

It is a further object of this invention to provide a novel process for producing a stencil which does not require a separate washout operation.

It is a still further object of this invention to provide a novel process for producing a stencil which involves the photopolymerization of a vinyl monomer directly upon a stencil screen fabric.

Another object of this invention is to provide a novel stencil suitable for printing with ink having the image thereof formed of polymerized vinyl compounds.

Other objects and advantages of this invention will appear to those skilled in the art from the detailed description thereof given below.

According to this invention, a photopolymerizable coating containing a photocatalyst, a normally liquid to solid monomer containing the grouping $CH_2=C<$ and a colloidal carrier soluble in water as well as in organic solvents is applied to a suitable stencil screen fabric which may be open-textured, strong, thin and long fibered material well known for this purpose, such as, for example, Yoshino paper, plain-weave silk cotton organdy, synthetic fabrics as rayon, nylon, polyester tissues or metal screen. The coated fabric is then exposed through a photographic positive to a visible light source. The exposed coating is then treated with a peroxide solution by dipping, wiping, spraying or the like. This induces polymerization in the exposed areas. The unreacted unexposed areas containing monomer and colloidal carrier are then eliminated by a warm water treatment leaving on the filmbase a polymerized resist negative to the original photographic positive.

As the photocatalyst of the photopolymerizable coating, we may use any photoreducible iron salt, such as, for example, ferric ammonium citrate, ferric oxalate, ferric tartrate and the like.

Any normally liquid to solid monomer containing the grouping $CH_2=C<$, whether soluble in water or not, may be used in our novel coating such as, for example, acrylamide, N-methylol acrylamide, calcium acrylate, methacrylamide, vinyl acetate, methylmethacrylate, acrylonitrile, mixtures of these compounds and the like. We also prefer to add a cross-linking agent to the monomer to increase the efficiency of the polymerization reaction, and to this end we employ an unsaturated compound containing at least two terminal vinyl groups each linked to a carbon atom in a straight chain or in a ring. Among the cross-linking agents that we may use, the following are listed: N,N'-methylene-bis-acrylamide, triallyl cyanurate, divinyl benzene, divinyl ketone and the like.

Any of the known organic or inorganic peroxides or hydro-peroxides may be used to induce the polymerization of the vinyl monomers such as, for example, hydrogen peroxide, ammonium persulfate, methyl hydro-peroxide, ethyl hydro-peroxide, cumene hydro-peroxide and many others.

Application Serial No. 808,882, filed April 27, 1959, now U.S. Patent 3,101,270, discloses a large number of monomers, as well as ferric salts and per compounds, which may be used in the photopolymerization of vinyl monomers. Any of the monomers, ferric salts and per compounds listed in the above mentioned application may be used in making our novel stencil.

The colloidal carrier of the coating may be gelatin or any of the well-known gelatin substitutes such as, for example, polyvinyl alcohol, polyacrylamide, carboxy methyl cellulose, hydroxy ethyl cellulose and the like.

Most of the colloidal compounds mentioned above can be eliminated from the coating only by an additional washout operation. In a modification of our invention, which is a preferred modification, we, therefore, use a colloidal carrier which serves not only as a dispersing medium for the iron salt, the monomer and the cross-linking agent, but which may also be removed partially or totally by the same peroxide solution which produces polymerization in the areas where the iron salt of the coating is reduced to the ferrous state. Polyvinyl pyrrolidone and certain polyethylene glycols such as Carbowax PF-45 and 4000 are examples of such colloidal carriers. These colloidal carriers are not only soluble in water but also in many organic solvents such as methanol, ethanol, propanol, butanol, cyclohexanol, ethyl acetate, diacetone alcohol, amines and the like.

Consequently, if a stencil base like Yoshino paper, silk, nylon and the like is coated with a composition comprising a photosensitive iron salt and a polymerizable monomer dispersed in such a colloidal carrier, such a coating, after exposure to a transparent or opaque original, can be transferred directly to the stencil applicator. The stencil sheet may then be wiped over with a weak solution of an inorganic or organic peroxide and, by the mere application of the organic or inorganic peroxide solution to the exposed stencil sheet, not only polymerization at the exposed areas but removal of the monomer and colloidal carrier from the unexposed areas takes place as well. No further operations are required and the stencil sheet is now ready for printing purposes. Clean whites are obtained in areas where the polymerized parts of the stencil bar the penetration of the oily ink, and sharp line and halftone printing result from the penetration of ink through areas where no polymerization took place and where the non-reacted monomer and the colloidal carrier were removed simultaneously during the polymerization of the monomer.

Solvents for the organic peroxides are chosen in such a manner that they constitute not only a solvent for the organic oxidizing agent, but they are also capable of dissolving the colloidal carrier of the stencil coating. In the case of polyvinyl pyrrolidone, solvents such as methanol, methyl acetate, acetone and the like are suitable. Solvents with a low boiling point induce, at the same time, an accelerated drying of the wet areas of the stencil.

The following specific examples of our invention are given. It is to be understood, however, that these examples are given by way of illustration and not by way of limitation.

*Example I*

A composition comprising

| | | |
|---|---|---|
| Gelatin (15%) | cc | 20 |
| Acrylamide | g | 3.22 |
| N,N'-methylene-bis-acrylamide | g | 0.125 |
| Ferric ammonium citrate (1.0 M) | cc | 1 |
| Duponol C (25%) | cc | 0.1 |
| Glycerin | cc | 0.5 |

was coated on a stencil screen mesh and dried. The coating was then exposed through a photographic positive with a 375 watt photoflood lamp placed at a distance of 30" from the stencil for 20 seconds. After exposure, the coating was wiped over with a 2% hydrogen peroxide solution which caused an immediate polymerization of the exposed portions of the coating. The coating was then submitted to a washout treatment with lukewarm water (40% C.) and the unexposed unpolymerized portions of the coating were removed. After drying, the stencil was ready for printing on a stencil applicator.

*Example II*

A stencil silk screen mesh was coated with the following composition:

| | | |
|---|---|---|
| Polyvinyl pyrrolidone (20% aqueous solution) | cc | 20 |
| Acrylamide | g | 3.22 |
| N,N'-methylene-bis-acrylamide | g | 0.125 |
| Ferric ammonium citrate (1.0 M) | cc | 1 |
| Glycerin | cc | 0.25 |
| Duponol C (25%) | cc | 2 |
| Water | cc | 5 |

The coating was then dried and exposed for 20 seconds through a photographic positive with a 375 watt photoflood lamp placed at a distance of 30" from the stencil.

The stencil was then fixed on the stencil applicator and wiped for from 30–60 seconds with a solution of 1 part, by weight, of cumene hydro-peroxide in 6 parts, by weight, of acetone. After drying for a few seconds, the stencil was ready for printing.

*Example III*

The same procedure was followed as in Example II, except that the coating composition of Example II was replaced with the following composition:

| | | |
|---|---|---|
| Carbowax PF–45 (15% aqueous solution) (Carbide & Carbon Chemical Company) | cc | 30 |
| Acrylamide | g | 3.0 |
| N,N'-methylene-bis-acrylamide | g | 0.2 |
| Ferric ammonium citrate (1.0 M) | cc | 3.0 |
| Duponol C (25%) | cc | 0.1 |
| Water | cc | 5.0 |

The results obtained were substantially the same as those of Example II.

Modifications of the invention will occur to persons skilled in the art. Thus, in lieu of any of the monomers mentioned in the examples, we may use any vinyl monomer; similarly, other light sensitive ferric compounds as well as per compounds may be used. We, therefore, do not intend to be limited in the patent granted except as necessitated by the appended claims.

We claim:

1. A photosensitive stencil comprising fibrous stencil screen material having a photosensitive coating thereon comprising acrylamide, N,N'-methylene-bis-acrylamide and ferric ammouium citrate dispersed in a water soluble colloidal carrier.

2. A photosensitive stencil as recited in claim 1, wherein the colloidal carrier is polyvinyl pyrrolidone.

3. A photosensitive stencil as recided in claim 1, wherein the stencil screen material is Yoshino paper.

References Cited in the file of this patent

UNITED STATES PATENTS

| | | |
|---|---|---|
| 2,291,130 | Alink | July 28, 1942 |
| 2,344,785 | Owens | Mar. 21, 1944 |
| 2,413,973 | Howk et al. | Jan. 7, 1947 |
| 2,661,331 | Howard | Dec. 1, 1953 |
| 2,927,021 | Sorkin | Mar. 1, 1960 |
| 2,997,391 | Murray et al. | Aug. 22, 1961 |
| 3,101,270 | Evans et al. | Aug. 20, 1963 |

FOREIGN PATENTS

| | | |
|---|---|---|
| 665,649 | Great Britain | March 8, 1950 |

OTHER REFERENCES

Heitt et al.: Silk-Screen Process Production, Blandford Press Ltd. (London), 1950, pages 107–109.